(12) United States Patent
Han

(10) Patent No.: US 7,667,749 B2
(45) Date of Patent: Feb. 23, 2010

(54) IMAGE SENSOR HAVING A PARTIAL LIGHT-SHIELDING LAYER AND METHOD FOR FABRICATING THE SAME

(75) Inventor: Chang Hun Han, Kyunggido (KR)

(73) Assignee: Dongbu Electronics Co., Ltd., Seoul (KR)

( * ) Notice: Subject to any disclaimer, the term of this patent is extended or adjusted under 35 U.S.C. 154(b) by 597 days.

(21) Appl. No.: 11/020,525

(22) Filed: Dec. 27, 2004

(65) Prior Publication Data

US 2005/0140805 A1 Jun. 30, 2005

(30) Foreign Application Priority Data

Dec. 31, 2003 (KR) .................. 10-2003-0101702

(51) Int. Cl.
*H04N 3/14* (2006.01)
*H01L 31/062* (2006.01)
*H04N 5/225* (2006.01)

(52) U.S. Cl. .................. 348/272; 348/302; 257/440; 257/294; 250/208.1

(58) Field of Classification Search ......... 348/302–304, 348/307–310, 272–273, 276, 277; 250/208.1, 250/214.1, 216; 257/440, 291, 292, 290, 257/293, 294
See application file for complete search history.

(56) References Cited

U.S. PATENT DOCUMENTS 4,242,694 A * 12/1980 Koike et al. .................. 257/294

(Continued)

FOREIGN PATENT DOCUMENTS

JP 53-69526 6/1978

(Continued)

OTHER PUBLICATIONS

First Office Action from the State Intellectual Property Office of People's Republic of China, dated Oct. 19, 2007, in counterpart Chinese Patent Application No. 2004101036153.

(Continued)

*Primary Examiner*—Lin Ye
*Assistant Examiner*—Carramah J Quiett
(74) *Attorney, Agent, or Firm*—Finnegan, Henderson, Farabow, Garrett & Dunner, L.L.P.

(57) ABSTRACT

An image sensor and a method for fabricating the same are disclosed, in which a partial light-shielding layer is additionally arranged on a path of a particular colored light, for example, a red colored light that may cause excessive permeation, to partially shield the corresponding red colored light in a state that red colored light, green colored light and blue colored light are permeated into each photodiode of a semiconductor substrate, so that the permeation position of the red colored light coincides with that of the green colored light and the blue colored light each having the wavelength shorter than that of the red colored light, thereby normally generating optical charges caused by the red colored light in an effective depletion area of the photodiode like those caused by the green colored light and the blue colored light. The permeation position of a red colored light, a green colored light and a blue colored light coincides with one another within a depletion area of a semiconductor substrate to obtain an optimal effective ratio from respective optical charges and the uniform quantity of the respective optical charges can be transferred/discharged to an interpolation circuit by signal processing transistors, thereby effectively displaying color images having excellent display quality (in color and resolution) approximate to a ratio of 1:1:1 with red, green and blue.

7 Claims, 6 Drawing Sheets

U.S. PATENT DOCUMENTS

| | | | |
|---|---|---|---|
| 5,759,878 A * | 6/1998 | Hayashi et al. | 438/151 |
| 6,255,640 B1 * | 7/2001 | Endo et al. | 250/208.1 |
| 6,379,992 B2 | 4/2002 | Jo | |
| 6,504,188 B1 * | 1/2003 | Maruyama et al. | 257/222 |
| 6,960,799 B2 * | 11/2005 | Descure | 257/292 |
| 7,345,703 B2 * | 3/2008 | Lee | 348/272 |
| 2001/0054677 A1 * | 12/2001 | Nakashima | 250/208.1 |

FOREIGN PATENT DOCUMENTS

| | | |
|---|---|---|
| JP | 59-163860 | 9/1984 |
| JP | 01-130562 | 5/1989 |
| JP | 05-326909 | 12/1993 |
| JP | 09-181288 | 7/1997 |
| JP | 2000-150846 | 5/2000 |
| JP | 2003-264281 | 9/2003 |

OTHER PUBLICATIONS

English Translation of the Notification of Reason for Rejection issued on Mar. 17, 2008, from the Japanese Patent Office in a counterpart Japanese Patent Application No. 2004-376943.

Final Rejection from the Japanese Patent Office mailed Oct. 31, 2008, in Japanese Patent Application No. 2004-376943, and English translation thereof.

* cited by examiner

IMAGE SENSOR HAVING A PARTIAL LIGHT-SHIELDING LAYER AND METHOD FOR FABRICATING THE SAME

This application claims the benefit of the Korean Application No. P2003-101702 filed on Dec. 31, 2003, which is hereby incorporated by reference.

BACKGROUND OF THE INVENTION

1. Field of the Invention

The present invention relates to an image sensor, and more particularly, to an image sensor and a method for fabricating the same in which a partial light-shielding layer is additionally arranged on a path of a particular colored light, for example, a red colored light that may cause excessive permeation, to partially shield the corresponding red colored light in a state that a red colored light, a green colored light, and a blue colored light are permeated into each photodiode of a semiconductor substrate, so that the permeation position of the red colored light coincides with that of the green colored light and the blue colored light each having the wavelength shorter than that of the red colored light, thereby normally generating optical charges caused by the red colored light in an effective depletion area of the photodiode like those caused by the green colored light and the blue colored light.

2. Discussion of the Related Art

Recently, with rapid development of the electric and electronic technology, various electronic appliances such as video cameras, digital cameras, personal computers with a small sized camera, and cellular phones with a small sized camera have been widely spread.

A charge coupled device (CCD) has been typically used as a related art image sensor. However, the CCD has several drawbacks in that a high driving voltage is required, an additional circuit is required, and the process cost is high. For these reasons, the use of the CCD is on a decreasing trend.

As an example of an image sensor that can substitute for the CCD, a complementary metal oxide semiconductor (CMOS) image sensor has received much attention recently. Since a CMOS image sensor is based on a CMOS circuit technology, it has advantages in that low voltage driving is available, no additional circuit is required, and the process cost is cheap unlike the CCD.

As shown in FIG. 1, the related art CMOS image sensor, i.e., a CMOS image sensor for displaying color images includes photodiodes 30 formed on a semiconductor substrate 40, generating and storing a series of optical charges from externally input lights L, and a color filter array CA coloring the externally input lights and transferring the colored lights to the photodiodes 30. In this case, an intermediate layer 20 is interposed between the color filter array and the photodiodes 30 so as to transfers the lights, which have transmitted the color filter array CA, to the photodiodes 30.

As shown, the color filter array CA includes a structure of a plurality of unit color cells C1, C2 and C3 with red, green and blue in combination (four color cells are shown in FIG. 1).

In this state, the red color cell C1, the green color cell C2, and the blue color cell C3 color the externally input lights in red, green and blue, and transfer the colored lights to the photodiodes 30. The respective photodiodes 30 corresponding to the red color cell C1, the green color cell C2 and the blue color cell C3 one to one generate and store the colored lights, i.e., optical charges corresponding to red colored light, green colored light and blue colored light.

Afterwards, signal processing transistors (not shown) adjacent to the respective photodiodes 30 transfer/discharge the optical charges generated and stored by the corresponding photodiodes 30 to an interpolation circuit (not shown). The optical charges are displayed in color images of uniform resolution by interpolation procedure through the corresponding interpolation circuit.

Under the related art CMOS image sensor system, the red colored light has a wavelength of 600 nm to 700 nm longer than the blue colored light having a wavelength of 400 nm to 500 nm and the green colored light having a wavelength of 500 nm to 600 nm. Therefore, as shown in FIG. 2, the red colored light which has transmitted the red color cell C1 is excessively permeated into the semiconductor substrate 40 in comparison with the green colored light which has transmitted the green color cell C2 and the blue colored light which has transmitted the blue color cell C3. If the red colored light is excessively permeated into the substrate 40, optical charges e1 caused by the red colored light are not generated normally in the effective depletion area DA of the photodiodes 30 unlike optical charges e2 and e3 caused by the green colored light and the blue colored light. That is, the optical charges e1 caused by the red colored light are generated abnormally spaced apart from the effective depletion area DA. Under the circumstances, if no separate step is taken, the optical charges e1 transferred/discharged to the interpolation circuit by the signal processing transistors are relatively smaller than the other optical charges e2 and e3. For this reason, the color images finally obtained by the interpolation circuit do not have a normal ratio of 1:1:1 with red, green and blue, thereby causing low display quality in color and resolution.

SUMMARY OF THE INVENTION

Accordingly, the present invention is directed to an image sensor and a method for fabricating the same that substantially obviates one or more problems due to limitations and disadvantages of the related art.

An object of the present invention is to provide an image sensor and a method for fabricating the same in which a partial light-shielding layer is additionally arranged on a path of a particular colored light, for example, a red colored light that may cause excessive permeation, to partially shield the corresponding red colored light in a state that a red colored light, a green colored light and a blue colored light are permeated into each photodiode of a semiconductor substrate, so that the permeation position of the red colored light coincides with that of the green colored light and the blue colored light each having the wavelength shorter than that of the red colored light, thereby normally generating optical charges caused by the red colored light in an effective depletion area of the photodiode like those caused by the green colored light and the blue colored light.

Another object of the present invention is to provide an image sensor and a method for fabricating the same in which the permeation position of red colored light, green colored light and blue colored light coincides with one another within a depletion area of a semiconductor substrate to obtain an optimal effective ratio from respective optical charges and the uniform quantity of the respective optical charges can be transferred/discharged to an interpolation circuit by signal processing transistors, thereby effectively displaying color images having excellent display quality (in color and resolution) approximate to a ratio of 1:1:1 with red, green and blue.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an image sensor includes a plurality of unit color cells coloring externally input lights in different colors, a plurality of photodiodes arranged in an active region of a semiconductor substrate, generating and storing a series of optical charges by receiving different colored lights which have transmitted the respective unit color cells, an intermediate layer transferring the different colored lights, which have transmitted the unit color cells, to the photodiodes, and a partial light-shielding layer partially shielding a particular colored light transferred to the photodiodes through the intermediate layer.

Preferably, the partial light-shielding layer is of a silicon based thin layer, such as a polysilicon thin layer having a thickness between 300 Å and 5000 Å.

Preferably, the particular colored light partially shielded by the partial light-shielding layer is a red colored light or a green colored light. If the particular colored light partially shielded by the partial light-shielding layer is a green colored light, the partial light-shielding layer has a thickness between $\frac{1}{20}$ and $\frac{1}{10}$ of that of the red colored light.

In another aspect, an image sensor includes a plurality of photodiodes arranged in an active region of a semiconductor substrate, generating and storing a series of optical charges by receiving different colored lights which have transmitted unit color cells, signal processing transistors transferring/discharging the optical charges stored in the photodiodes, a metal pre-insulating layer formed on the semiconductor substrate to cover the photodiodes and the signal processing transistors, a metal line formed on the metal pre-insulating layer to electrically connect with the signal processing transistors, and a partial light-shielding layer buried in the metal pre-insulating layer, partially shielding a particular colored light transferred from the unit color cells to the photodiodes.

In still another aspect, an image sensor includes a plurality of photodiodes arranged in an active region of a semiconductor substrate, generating and storing a series of optical charges by receiving different colored lights which have transmitted unit color cells, signal processing transistors transferring/discharging the optical charges stored in the photodiodes, a metal pre-insulating layer formed on the semiconductor substrate to cover the photodiodes and the signal processing transistors, multi-layered metal lines formed on the metal pre-insulating layer, multi-layered insulating interlayers selectively insulating the multi-layered metal lines, and a partial light-shielding layer buried in one of the multi-layered insulating interlayers, partially shielding a particular colored light transferred from the unit color cells to the photodiodes.

In other aspect, a method for fabricating an image sensor includes forming a plurality of photodiodes and signal processing transistors in an active region of a semiconductor substrate, forming a first metal pre-insulating layer on the semiconductor substrate to cover the photodiodes and the signal processing transistors, forming a partial light-shielding layer partially shielding a particular colored light transferred to the photodiodes on the first metal pre-insulating layer, and forming a second metal pre-insulating layer on the first metal pre-insulating layer to cover the partial light-shielding layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, an image sensor according to the present invention and a method for fabricating the same will be described as follows.

Figure 1:
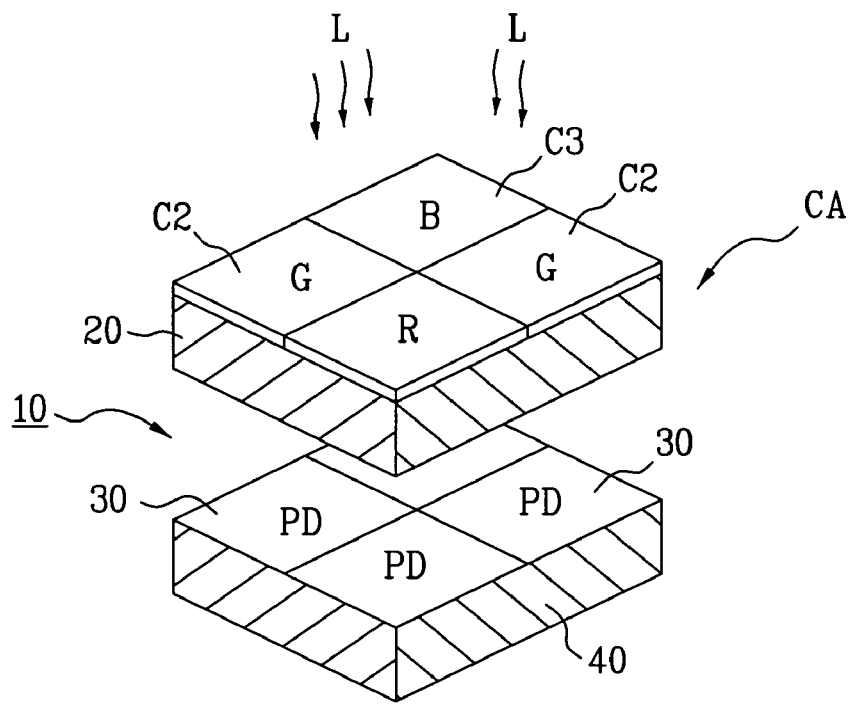
FIG. 1 and FIG. 2 are exemplary views illustrating a structure of a related art image sensor.
Figure 2:
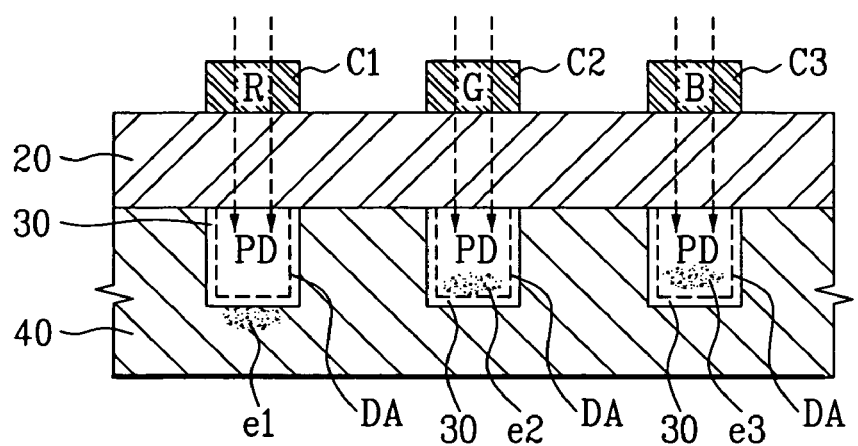
Figure 3:
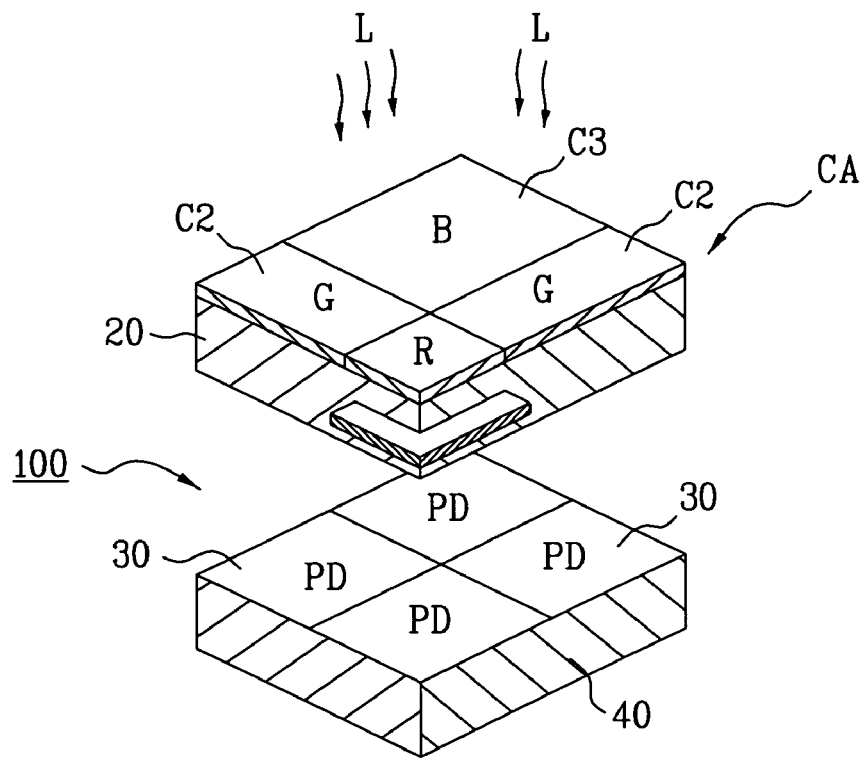
FIG. 3 and FIG. 4 are exemplary views illustrating a structure of an image sensor according to one embodiment of the present invention.

As shown in FIG. 3, a CMOS image sensor 100 of the present invention, i.e., a CMOS image sensor for displaying color images includes photodiodes 30 formed on a semiconductor substrate 40, generating and storing a series of optical charges from externally input lights L, and a color filter array CA coloring the externally input lights and transferring the colored lights to the photodiodes 30. In this case, an intermediate layer 20 is interposed between the color filter array CA and the photodiodes 30 so as to transfer the lights, which have transmitted the color filter array CA, to the photodiodes 30.

The color filter array CA includes a structure of a plurality of unit color cells C1, C2 and C3 with red, green and blue in combination, as shown.

In this state, the red color cell. C1, the green color cell C2, and the blue color cell C3 color the externally input lights in red, green and blue, and transfer the colored lights to the photodiodes 30. The respective photodiodes 30 corresponding to the red color cell C1, the green color cell C2 and the blue color cell C3 one to one generate and store the colored lights, i.e., optical charges corresponding to red colored light, green colored light and blue colored light.

Afterwards, signal processing transistors 60 (shown in FIG. 5) adjacent to the respective photodiodes 30 transfer/discharge the optical charges generated and stored by the corresponding photodiodes 30 to an interpolation circuit. The optical charges are displayed in color images of uniform resolution by the interpolation procedure through the corresponding interpolation circuit.

In this case, since a user is generally sensitive to green colored light, in the present invention as shown, green unit color cells C2 more than the red unit color cell C1 and the blue unit color cell C3 are arranged in the color filter array CA.

Under the CMOS image sensor system of the present invention, as described above, the red colored light has a wavelength of 600 nm to 700 nm longer than the blue colored light having a wavelength of 400 nm to 500 nm and the green colored light having a wavelength of 500 nm to 600 nm. Therefore, if no separate step is taken, the red colored light which has transmitted the red color cell C1 is excessively permeated into the semiconductor substrate 40 in comparison with the green colored light which has transmitted the green color cell C2 and the blue colored light which has transmitted the blue color cell C3.

Under the circumstances, as shown, a partial light-shielding layer 50 is additionally formed on some portion of a particular unit color cell, for example, some portion of the intermediate layer 20 corresponding to the red unit color cell C1 that may cause excessive permeation, to partially shield the corresponding red colored light transferred to the photodiodes 30 through the corresponding intermediate layer 20.

Figure 4:
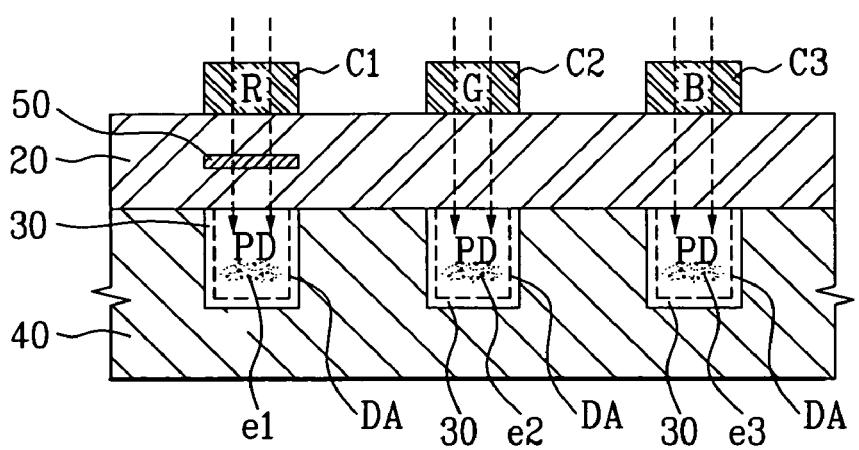

Under the condition that the partial light-shielding layer 50 is formed on some portion of the intermediate layer 20 corresponding to the red unit color cell C1, if the red colored light which has transmitted the red unit color cell C1 is input to the photodiodes 30, as shown in FIG. 4, the corresponding red colored light is not excessively permeated into the substrate 40 due to the partial light-shielding layer 50 even if it has a long wavelength of 600 nm to 700 nm. Thus, the permeation position of the red colored light coincides with that of the green colored light and the blue colored light each having the wavelength shorter than that of the red colored light.

In the related art, since the red colored light has a relatively long wavelength, the red colored light which has transmitted the red color cell is excessively permeated into the semiconductor substrate in comparison with the green colored light which has transmitted the green color cell and the blue colored light which has transmitted the blue color cell. For this reason, optical charges caused by the red colored light are not generated normally in the effective depletion area of the photodiodes unlike optical charges caused by the green colored light and the blue colored light. That is, the optical charges caused by the red colored light are generated abnormally spaced apart from the effective depletion area.

However, in the present invention, since the partial light-shielding layer 50 is formed on a path of a particular colored light, for example, the red colored light that may cause excessive permeation, the permeation position of the red colored light coincides with that of the green colored light and the blue colored light each having the wavelength shorter than that of the red colored light. Thus, the optical charges e1 caused by the red colored light can normally be generated in the effective depletion area of the photodiodes 30 like those e2 and e3 caused by the green colored light and the blue colored light.

In the present invention, the permeation position of the red colored light, the green colored light and the blue colored light coincides with one another within the effective depletion area DA of the semiconductor substrate 40 to obtain an optimal effective ratio from the respective optical charges e1, e2 and e3. In this case, the uniform quantity of the respective optical charges can be transferred/discharged to the interpolation circuit by the signal processing transistors 60. Thus, color images having excellent display quality (in color and resolution) approximate to a ratio of 1:1:1 with red, green and blue can finally be displayed by the interpolation circuit.

In the present invention, the thickness of the partial light-shielding layer 50 acts as a sensitive factor. In this respect, some problems may occur as follows. That is, if the partial light-shielding layer 50 is too thick, the light which has transmitted the red unit color cell C1 may fail to reach the photodiodes 30. By contrast, if the partial light-shielding layer 50 is too thin, it may fail to perform its light-shielding function. Considering such problems, the partial light-shielding layer 50 has a thickness between 300 Å and 5000 Å in the present invention. In this case, the above problems may be avoided in advance.

Meanwhile, in the present invention, the material of the partial light-shielding layer 50 acts as a sensitive factor. Like the case of the thickness as described above, some problems may occur as follows. That is, if the partial light-shielding layer 50 is approximate to an opaque material, the light which has transmitted the red unit color cell C1 may fail to reach the photodiodes 30. By contrast, if the partial light-shielding layer 50 is approximate to a transparent material, it may fail to perform its light-shielding function. Considering such problems, the partial light-shielding layer 50 is of a silicon based thin layer having appropriate transparency, such as a polysilicon thin layer. In this case, the above problems may be avoided in advance.

Figure 5:
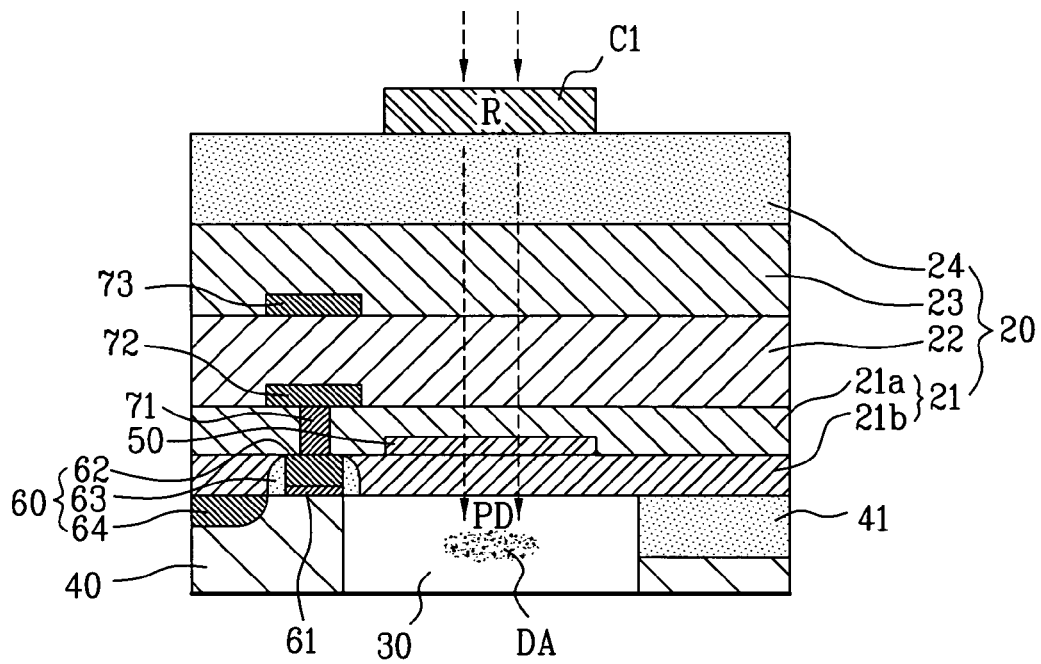
FIG. 5 to FIG. 7 are exemplary views illustrating arrangement of a partial light-shielding layer according to the present invention.
Figure 6:
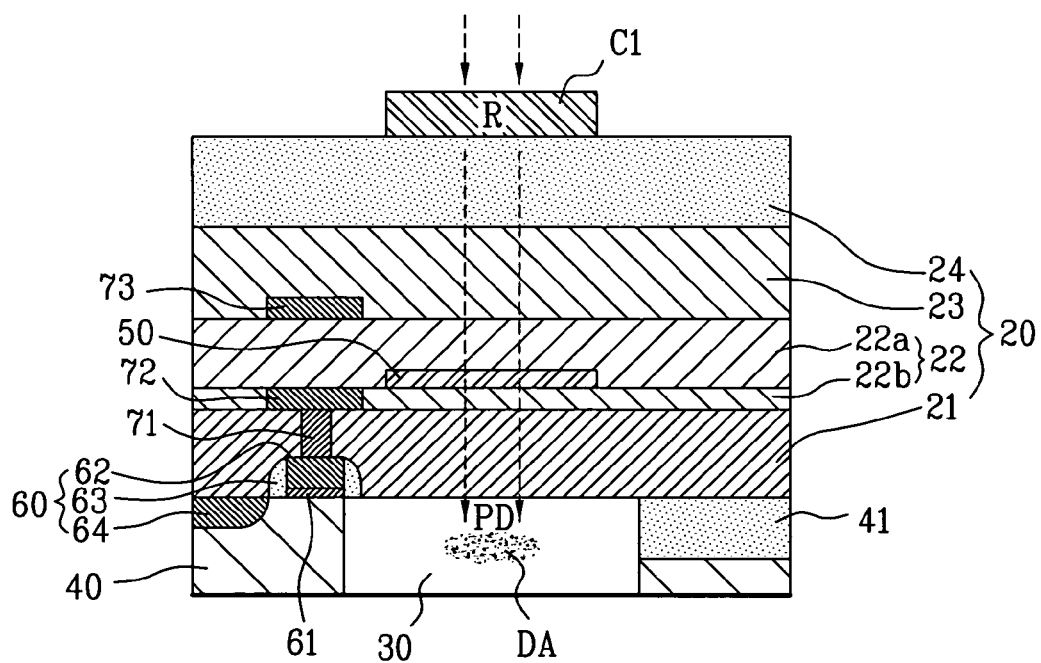
Figure 7:
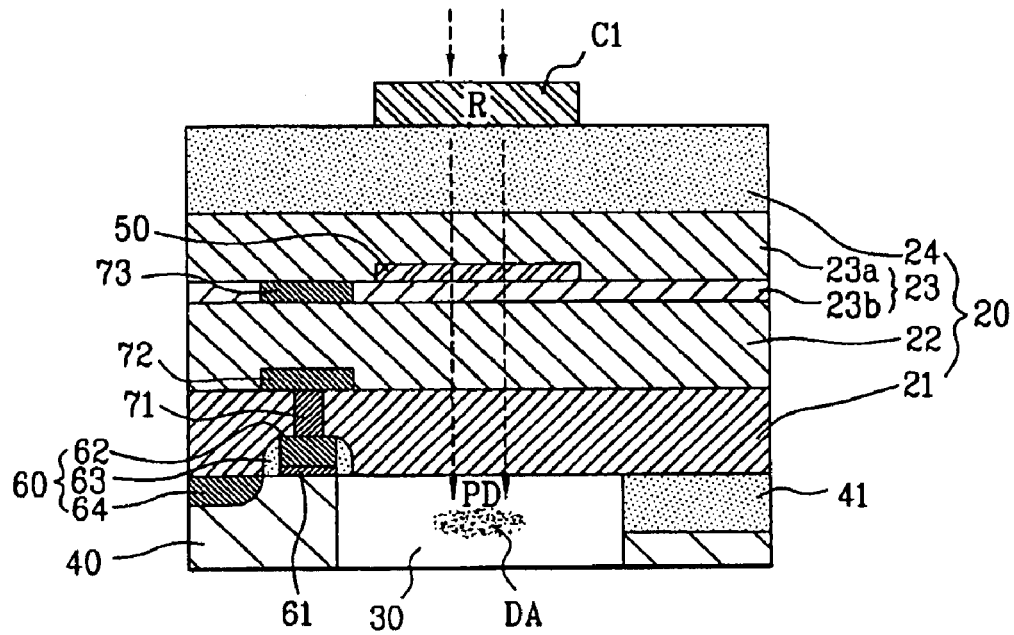

As shown in FIG. 5 to FIG. 7, the position of the partial light-shielding layer 50 may be varied in the intermediate layer 20 depending on circumstances.

For example, as shown in FIG. 5, the partial light-shielding layer 50 may be buried in a metal pre-insulating layer 21 of the intermediate layer 20. In this case, the image sensor 100 includes a plurality of photodiodes 30 arranged in an active region of a semiconductor substrate 40, which is defined by a device isolation layer 41, generating and storing a series of optical charges e1 by receiving a red colored light which has transmitted red unit color cell C1, signal processing transistors 60 transferring/discharging the optical charges e1 stored in the photodiodes 30, a first metal pre-insulating layer 21a formed on the semiconductor substrate 40 to cover the photodiodes 30 and to expose a gate electrode 62, a partial light-shielding layer 50 formed on the first metal pre-insulating layer 21a, partially shielding the red colored light transferred from the red unit color cell C1 to the photodiodes 30, a second metal pre-insulating layer 21b formed on the first metal pre-insulating layer 21a to cover the partial light-shielding layer 50, a first metal line 72 formed on the second metal pre-insulating layer 21b, being electrically connected with the signal processing transistors 60 through a contact plug 71, a first insulating interlayer 22 formed on the second metal pre-insulating layer 21b to cover the first metal line 72, a second metal line 73 formed on the first insulating interlayer 22, a second insulating interlayer 23 formed on the first insulating interlayer 22 to cover the second metal line 73, and a passivation layer 24 formed on the second insulating interlayer 23.

The signal processing transistors 60 include a gate insulating layer 61, a gate electrode 62 insulated from the semiconductor substrate 40 by the gate insulating layer 61, a spacer 63 formed at both sides of the gate electrode 62, and an impurity ion layer 64 formed in the semiconductor substrate 40 at one side of the spacer 63.

In this structure, by action of the partial light-shielding layer 50, the permeation position of the red colored light which has transmitted the red unit color cell C1 can naturally coincide with that of the green colored light and the blue colored light each having the wavelength shorter than that of the red colored light. Thus, the optical charges e1 caused by the red colored light can normally be generated in the effective depletion area DA of the photodiodes 30 like those e2 and e3 caused by the green colored light and the blue colored light.

Furthermore, as shown in FIG. 6, the partial light-shielding layer 50 may be buried in an insulating interlayer of the intermediate layer 20, for example, the first insulating interlayer 22. In this case, the image sensor 100 includes a plurality of photodiodes 30 arranged in an active region of a semiconductor substrate 40, which is defined by a device isolation layer 41, generating and storing a series of optical charges by receiving a red colored light which has transmitted red unit color cell C1, signal processing transistors 60 transferring/discharging the optical charges e1 stored in the photodiodes 30, a metal pre-insulating layer 21 formed on the semiconductor substrate 40 to cover the photodiodes 30 and the signal processing transistors 60, a first metal line 72 formed on the metal pre-insulating layer 21, being electrically connected with the signal processing transistors 60 through a contact plug 71, a first lower insulating interlayer 22a formed on the metal pre-insulating layer 21 to expose the first metal line 72, a partial light-shielding layer 50 formed on the first lower insulating interlayer 22a, partially shielding the red colored light transferred from the red unit color cell C1 to the photodiodes 30, a first upper insulating interlayer 22b formed on the first lower insulating interlayer 22a to cover the partial light-shielding layer 50, a second metal line 73 formed on the first upper insulating interlayer 22b, a second insulating interlayer 23 formed on the first upper insulating interlayer 22b to cover the second metal line 73, and a passivation layer 24 formed on the second insulating interlayer 23.

In this structure in the same manner as the aforementioned case of FIG. 5, by action of the partial light-shielding layer 50, the permeation position of the red colored light which has transmitted the red unit color cell C1 can naturally coincide with that of the green colored light and the blue colored light each having the wavelength shorter than that of the red colored light. Thus, the optical charges e1 caused by the red colored light can normally be generated in the effective depletion area DA of the photodiodes 30 like those e2 and e3 caused by the green colored light and the blue colored light.

Besides, as shown in FIG. 7, the partial light-shielding layer 50 may be buried in an insulating interlayer of the intermediate layer 20, for example, the second insulating interlayer 23. In this case, the image sensor 100 includes a plurality of photodiodes 30 arranged in an active region of a semiconductor substrate 40, which is defined by a device isolation layer 41, generating and storing a series of optical charges e1 by receiving a red colored light which has transmitted red unit color cell C1, signal processing transistors 60 transferring/discharging the optical charges e1 stored in the photodiodes 30, a metal pre-insulating layer 21 formed on the semiconductor substrate 40 to cover the photodiodes 30 and the signal processing transistors 60, a first metal line 72 formed on the metal pre-insulating layer 21, being electrically connected with the signal processing transistors 60 through a contact plug 71, a first insulating interlayer 22 formed on the metal pre-insulating layer 21 to cover the first metal line 72, a second metal line 73 formed on the first insulating interlayer 22, a second lower insulating interlayer 23a formed on the first insulating interlayer 22 to exposed the surface of the second metal line 73, a partial light-shielding layer 50 formed on the first lower insulating interlayer 23a, partially shielding the red colored light transferred from the red unit color cell C1 to the photodiodes 30, a second upper insulating interlayer 23b formed on the second lower insulating interlayer 23a to cover the partial light-shielding layer 50, and a passivation layer 24 formed on the second upper insulating interlayer 23b.

In this structure in the same manner as the aforementioned cases, by action of the partial light-shielding layer 50, the permeation position of the red colored light which has transmitted the red unit color cell C1 can naturally coincide with that of the green colored light and the blue colored light each having the wavelength shorter than that of the red colored light. Thus, the optical charges e1 caused by the red colored light can normally be generated in the effective depletion area DA of the photodiodes 30 like those e2 and e3 caused by the green colored light and the blue colored light.

A method for fabricating the aforementioned image sensor will now be described with reference to the partial light-shielding layer 50 buried in the metal pre-insulating layer 21 of the intermediate layer 20.

Figure 8A:
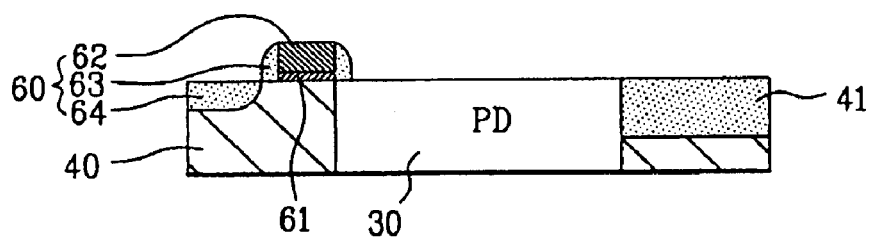
FIG. 8A to FIG. 8E are sectional views illustrating the process steps of fabricating an image sensor according to the present invention.

First, as shown in FIG. 8A, the device isolation layer 41 of the field region is formed to define the active region of the semiconductor substrate 40 by selectively performing a shallow trench isolation (STI) process or a local oxidation of silicon (LOCOS) process. In this case, a P-type epitaxial layer (not shown) may previously be formed on the semiconductor substrate 40 of a P++ type heavily doped monosilicon substrate, to increase the size (depth) of the depletion area.

Subsequently, a gate insulating layer 61 for a gate electrode 62 of the signal processing transistors is formed at a desired thickness on the region for the transistor of the active region by performing a low-pressure CVD process. In this case, the gate insulating layer 61 may be formed of a thermal oxide layer by a thermal oxidation process.

Next, a conductive layer for the gate electrode 62 is formed on the gate insulating layer 61 by performing a low-pressure CVD process. For an example of the conductive layer, a heavily doped polysilicon layer may be formed at a predetermined thickness. Furthermore, a silicide layer may be additionally formed on the heavily doped polysilicon layer.

After that, unnecessary portions are removed by photolithography using a photoresist pattern (not shown), and then spacers 63 are formed at both sides of the gate electrode 62. As a result, it is possible to complete a deposition structure of the gate insulating layer 61, the gate electrode 62 and the spacers 63 in the region for the transistor of the semiconductor substrate.

Although not shown, the aforementioned deposition structure may be formed on the predetermined portions of the semiconductor substrate 40.

Afterwards, impurity ions are implanted using the photoresist pattern as a masking layer, thereby respectively forming an impurity layer 64 for the signal processing transistors 60 and the photodiodes 30 for generating/storing the optical charges in the region for the transistor of the semiconductor substrate 40 and the region for the photodiode.

By additionally performing a CVD process depending on the circumstances, an etch-stop layer (not shown) may be additionally formed on the semiconductor substrate 40 including the spacers 63 and the gate electrode 62, wherein the etch-stop layer prevents the gate electrode 62 from being damaged due to the etching process. In this case, the etch-stop layer may be formed of a nitride layer or a nitride oxide layer.

Figure 8B:
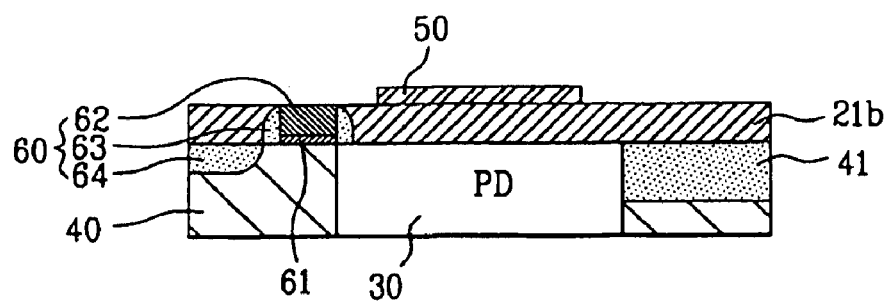

Meanwhile, after completing the signal processing transistors 60 and the photodiodes 30 by the aforementioned process, as shown in FIG. 8B, a deposition process is performed to form a first metal pre-insulating layer 21a to cover the signal processing transistors 60 and the photodiodes 30 on the semiconductor substrate 40.

In this case, the first metal pre-insulating layer 21a may be formed of an undoped silicate glass (USG) layer, a boron silicate glass (BSG) layer, a phosphorous silicate glass (PSG)

layer, a boron-phosphorous silicate glass (BPSG) layer, an ozone tetra ethyl ortho silicate (O$_3$-TEOS) layer, or a compound layer thereof.

Then, a silicon based thin layer, for example, a polysilicon thin layer is formed on the first metal pre-insulating layer 21a at a thickness between 300 Å and 5000 Å by performing a CVD process, and then the polysilicon thin layer is patterned to selectively form the partial light-shielding layer 50 for partially preventing the red colored light transferred to the photodiodes 30.

Figure 8C:
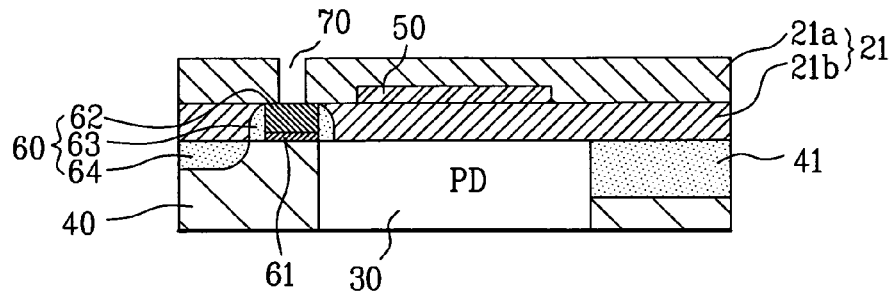

As shown in FIG. 8C, the second metal pre-insulating layer 21b is additionally formed on the first metal pre-insulating layer 21a including the partial light-shielding layer 50 by performing a deposition process. Like the first metal pre-insulating layer 21a, the second metal pre-insulating layer 21b may be formed of the USG layer, the BSG layer, the PSG layer, the BPSG layer, the O$_3$-TEOS layer, or the compound layer thereof. After completing the second metal pre-insulating layer 21b, the partial light-shielding layer 50 is substantially formed inside the metal pre-insulating layer 21.

Then, the second metal pre-insulating layer 21b is etched to expose the gate electrode 62 by photolithography, thereby forming a contact hole 70.

Figure 8D:
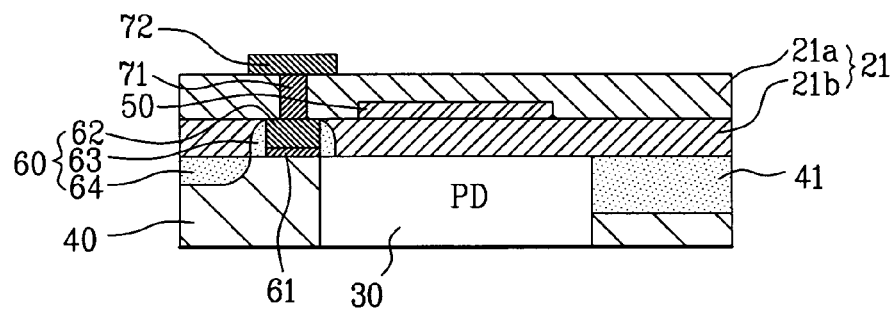

Next, as shown in FIG. 8D, a barrier metal layer (not shown) is formed on the inner surfaces of the contact hole 70, and a refractory metal layer, for example, a tungsten layer is thickly formed thereon, whereby the contact hole 70 is filled with the refractory metal layer. Thereafter, the refractory metal layer is planarized by a chemical-mechanical polishing (CMP) process, so as to form the contact plug 71 for electrically connecting the first metal line 72 and the gate electrode 62.

Figure 8E:
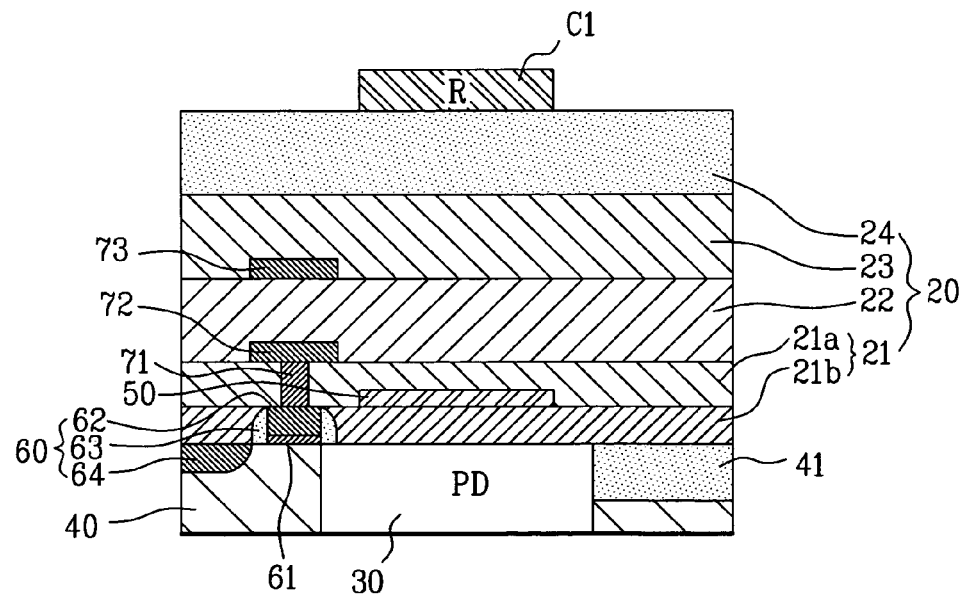

By additionally performing the deposition process, the patterning process, and the planarization process in sequence, as shown in FIG. 8E, it is possible to complete the image sensor 100 including the first metal line 72 formed on the second metal pre-insulating layer 21b, the first insulating interlayer 22 formed on the second metal pre-insulating layer 21b to cover the first metal line 72, the second metal line 73 formed on the first insulating interlayer 22, the second insulating interlayer 23 formed on the first insulating interlayer 22 to cover the second metal line 73, the passivation layer 24 formed on the second insulating interlayer 23, and the unit color cell C1 formed on the passivation layer.

Since the method for burying the partial light-shielding layer 50 in the first insulating interlayer 22 of the intermediate layer 20 and the method for burying the partial light-shielding layer 50 in the second insulating interlayer 23 of the intermediate layer 20 can be understood from the method for burying the partial light-shielding layer 50 in the metal pre-insulating layer 21, their detailed description will be omitted.

Meanwhile, in the image sensor 100 of the present invention, since the green colored light has a wavelength longer than that of the blue colored light, although shorter than that of the red colored light, the green colored light which has transmitted the green unit color cell C2 may be excessively permeated into the semiconductor substrate 40 in case of unexpected circumstances. In this case, the permeation position of the optical charges e2 caused by the green colored light may not coincide with the permeation position of the optical charges e3 caused by the blue colored light.

Figure 9:
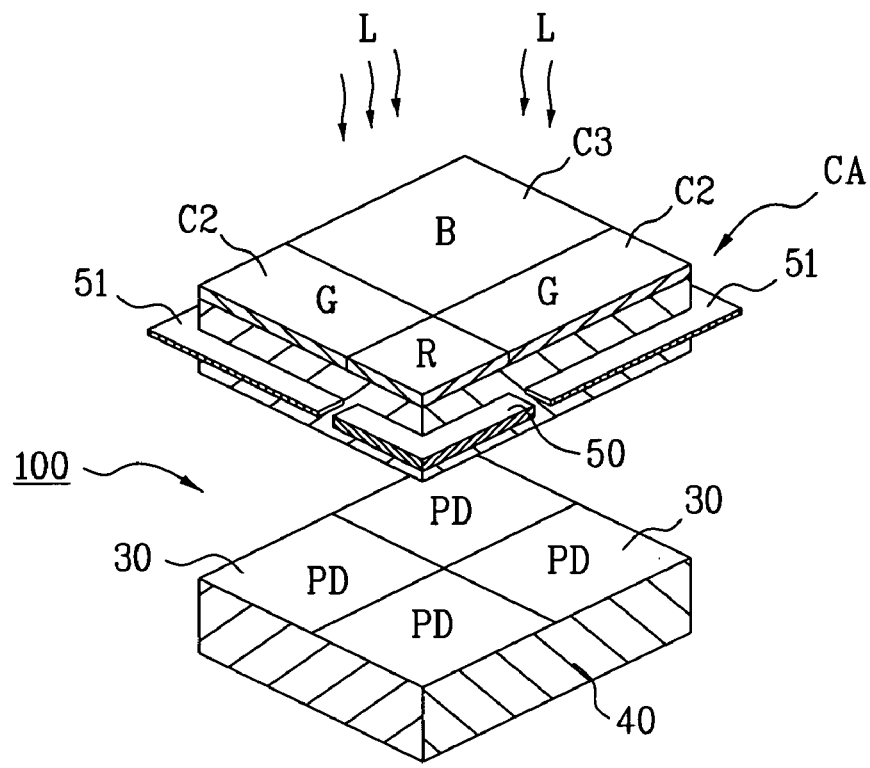
FIG. 9 and FIG. 10 are exemplary views illustrating a structure of an image sensor according to other embodiment of the present invention.

Considering the above fact in the other embodiment of the present invention, as shown in FIG. 9, a partial light-shielding layer 51 is additionally formed in some portion of the intermediate layer 20 corresponding to the green unit color cell C2 as well as some portion of the intermediate layer 20 corresponding to the red unit color cell C1.

Figure 10:
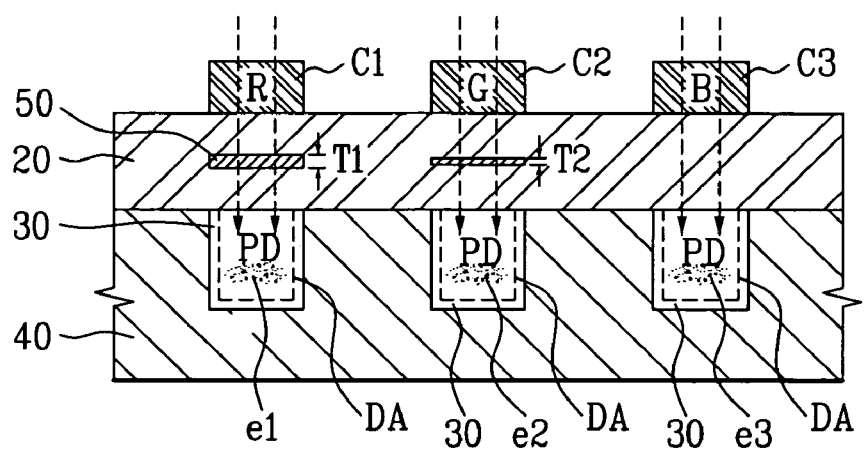

Under the condition that the partial light-shielding layer 51 is formed in some portion of the intermediate layer 20 corresponding to the green unit color cell C2, if the green colored light which has transmitted the green unit color cell C2 is input to the photodiodes 30, as shown in FIG. 10, the corresponding green colored light is not excessively permeated into the substrate 40 due to the partial light-shielding layer 51 even if it has a wavelength longer than that of the blue colored light. Thus, the permeation position of the green colored light coincides with that of the blue colored light having the wavelength shorter than that of the green colored light.

In the other embodiment of the present invention, the permeation position of the red colored light, the green colored light and the blue colored light coincides with one another within the effective depletion area DA of the semiconductor substrate 40 to obtain an optimal effective ratio from the respective optical charges e1, e2 and e3. In this case, the uniform quantity of the respective optical charges can be transferred/discharged to the interpolation circuit by the signal processing transistors 60. Thus, color images having excellent display quality (in color and resolution) approximate to a ratio of 1:1:1 with red, green and blue can finally be displayed by the interpolation circuit.

In the other embodiment of the present invention, the thickness T2 of the partial light-shielding layer 51 corresponding to the green colored light acts as a sensitive factor. In this respect, a problem may occur as follows. That is, if the partial light-shielding layer 51 corresponding to the green colored light has the same thickness as that of the partial light-shielding layer 50 corresponding to the red colored light in spite of the fact that the green colored light has a wavelength shorter than that of the red colored light, the light which has transmitted the green unit color cell C2 may fail to reach the photodiodes 30.

Considering such a problem, the partial light-shielding layer 51 corresponding to the green colored light has a thickness T2 between ½₀ and ⅟₁₀ of that of the partial light-shielding layer 50 corresponding to the red colored light. In this case, the light-shielding function of the partial light-shielding layer 51 corresponding to the green colored light becomes poorer than that of the partial light-shielding layer 50 corresponding to the red colored light. Thus, the green colored light can normally reach the photodiodes 30 without any problem.

As aforementioned, the image sensor and the method for fabricating the same have the following advantages.

Since the partial light-shielding layer is additionally arranged on the path of the particular colored light, for example, the red colored light that may cause excessive permeation, to partially shield the corresponding red colored light in a state that the red colored light, the green colored light and the blue colored light are permeated into each photodiode of the semiconductor substrate, the permeation position of the red colored light coincides with that of the green colored light and the blue colored light each having the wavelength shorter than that of the red colored light, thereby normally generating the optical charges caused by the red colored light in the effective depletion area of the photodiodes like those caused by the green colored light and the blue colored light.

In addition, the permeation position of the red colored light, the green colored light and the blue colored light coincides with one another within the effective depletion area of the semiconductor substrate to obtain an optimal effective ratio from the respective optical charges. In this case, since the uniform quantity of the respective optical charges can be transferred/discharged to the interpolation circuit by the signal processing transistors, color images having excellent display quality (in color and resolution) approximate to a ratio of 1:1:1 with red, green and blue can effectively be displayed by the interpolation circuit.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An image sensor comprising:
a plurality of unit color cells coloring externally input lights in red, green, and blue colors respectively having different wavelengths;
a plurality of photodiodes arranged in an active region of a semiconductor substrate, generating and storing a series of optical charges by receiving red, green, and blue colored lights which have been transmitted from the respective unit color cells;
an intermediate layer transferring the red, green, and blue colored lights, which have been transmitted from the unit color cells, to the photodiodes; and
a plurality of partial light-shielding layers formed on portions of the intermediate layer, partially shielding a particular colored light including a red colored light and a green colored light transferred to the photodiodes through the intermediate layer, wherein a first partial light-shielding layer shielding the green colored light has a thickness between $\frac{1}{20}$ and $\frac{1}{10}$ of a second partial light-shielding layer shielding the red colored light so that a permeation position of the red colored light coincides with a permeation position of the green colored light and a permeation position of the blue colored light.

2. The image sensor of claim 1, wherein the partial light-shielding layers comprise a silicon based thin layer.

3. The image sensor of claim 2, wherein the partial light-shielding layers comprise a polysilicon thin layer.

4. The image sensor of claim 1, wherein the partial light-shielding layers have a thickness between 300 Å and 5000 Å.

5. An image sensor comprising:
a plurality of photodiodes arranged in an active region of a semiconductor substrate, generating and storing a series of optical charges by receiving red, green, and blue colored lights which have been transmitted from unit color cells;
signal processing transistors transferring/discharging the optical charges stored in the photodiodes;
a metal pre-insulating layer formed on the semiconductor substrate to cover the photodiodes and the signal processing transistors;
a metal line formed on the metal pre-insulating layer to electrically connect with the signal processing transistors; and
a plurality of partial light-shielding layers buried in the metal pre-insulating layer, wherein the partial light-shielding layers partially shield a particular colored light including a red colored light and a green colored light transferred from the unit color cells to the photodiodes, and wherein a first partial light-shielding layer shielding the green colored light has a thickness between $\frac{1}{20}$ and $\frac{1}{10}$ of a second partial light-shielding layer shielding the red colored light so that a permeation position of the red colored light coincides with a permeation position of the green colored light and a permeation position of the blue colored light, wherein the plurality of partial light-shielding layers are buried in the metal pre-insulating layer.

6. An image sensor comprising:
a plurality of photodiodes arranged in an active region of a semiconductor substrate, generating and storing a series of optical charges by receiving red, green, and blue colored lights which have been transmitted from unit color cells;
signal processing transistors transferring/discharging the optical charges stored in the photodiodes;
a metal pre-insulating layer formed on the semiconductor substrate to cover the photodiodes and the signal processing transistors;
multi-layered metal lines formed on the metal pre-insulating layer;
multi-layered insulating interlayers selectively insulating the multi-layered metal lines; and
a plurality of partial light-shielding layers buried in one of the multi-layered insulating interlayers, wherein the partial light-shielding layers partially shield a particular colored light including a red colored light and a green colored light from the unit color cells to the photodiodes, and wherein a first partial light-shielding layer shielding the green colored light has a thickness between $\frac{1}{20}$ and $\frac{1}{10}$ of a second partial light-shielding layer shielding the red colored light so that a permeation position of the red colored light coincides with a permeation position of the green colored light and a permeation position of the blue colored light.

7. A method for fabricating an image sensor comprising:
forming a plurality of photodiodes and signal processing transistors in an active region of a semiconductor substrate;
forming a first metal pre-insulating layer on the semiconductor substrate to cover the photodiodes and the signal processing transistors;
forming a plurality of partial light-shielding layers on the first metal pre-insulating layer, wherein the plurality of partial light-shielding layers partially shield a particular colored light including a red colored light and a green colored light transferred to the photodiodes on the first metal pre-insulating layer, wherein a first partial light-shielding layer shielding the green colored light has a thickness between $\frac{1}{20}$ and $\frac{1}{10}$ of a second partial light-shielding layer shielding the red colored light so that a permeation position of the red colored light coincides with a permeation position of the green colored light and a permeation position of the blue colored light; and
forming a second metal pre-insulating layer on the first metal pre-insulating layer to cover the partial light-shielding layer.

* * * * *